(12) United States Patent
Yamashita et al.

(10) Patent No.: US 7,221,587 B2
(45) Date of Patent: May 22, 2007

(54) SEMICONDUCTOR DEVICE AND PROGRAMMING METHOD

(75) Inventors: Minoru Yamashita, Kanagawa (JP); Kazuhiro Kurihara, Tokyo (JP); Hiroaki Wada, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 35 days.

(21) Appl. No.: 11/126,738

(22) Filed: May 11, 2005

(65) Prior Publication Data

US 2005/0254329 A1    Nov. 17, 2005

Related U.S. Application Data

(63) Continuation of application No. PCT/JP2004/06263, filed on May 11, 2004.

(51) Int. Cl.
*G11C 11/34* (2006.01)
*G11C 16/04* (2006.01)

(52) U.S. Cl. .......................... 365/185.12; 365/185.16; 365/185.18

(58) Field of Classification Search ........... 365/185.12, 365/185.18, 185.23, 230.04, 185.16
See application file for complete search history.

(56) References Cited

U.S. PATENT DOCUMENTS

| 5,293,350 | A | * | 3/1994 | Kim et al. | 365/238.5 |
| 5,517,448 | A | * | 5/1996 | Liu | 365/185.11 |
| 5,592,000 | A | | 1/1997 | Onishi et al. | 357/315 |
| 5,801,994 | A | * | 9/1998 | Chang et al. | 365/185.29 |
| 6,771,536 | B2 | * | 8/2004 | Li et al. | 365/185.02 |
| 2002/0132436 | A1 | | 9/2002 | Eliyahu et al. | 438/323 |
| 2004/0047183 | A1 | * | 3/2004 | Tanaka et al. | 365/185.19 |

FOREIGN PATENT DOCUMENTS

| JP | 11297080 | 10/1999 |
| JP | 2004-110900 | 4/2004 |

* cited by examiner

*Primary Examiner*—Huan Hoang
*Assistant Examiner*—Kretelia Graham

(57) ABSTRACT

The semiconductor device of the present invention includes a column decoder (select and write circuit), which selects multiple pages that are not located adjacently to each other so as to simultaneously program multiple bits in the memory cells of the selected page, when the multiple bits are programmed in the multiple pages. The page is a selection unit and is composed of a given number of the memory cells located on a same word line. An unnecessary stress of programming is not applied to the memory cells that are not to be programmed, by increasing the distance between the memory cells to be programmed simultaneously.

5 Claims, 9 Drawing Sheets

SEMICONDUCTOR DEVICE AND PROGRAMMING METHOD

CROSS REFERENCE TO RELATED APPLICATIONS

This is a continuation of International Application No. PCT/JP2004/006263, filed May 11, 2004.

BACKGROUND OF THE INVENTION

1. Field of the Invention

The present invention relates to a semiconductor device in which multiple bits of data can be programmed and a programming method thereof.

2. Description of the Related Art

The semiconductor device such as a non-volatile semiconductor device is designed to have a large capacity with the advancements of the processing technology. Programming and erasing are increasingly demanded to be faster in accordance with the large capacity of the semiconductor device.

In a flash memory, all the bits have to be programmed before erasing, and so an increase in the programming speed increases the erasing speed. This is because multiple data are programmed by one byte (eight bits) or one word (16 bits) simultaneously.

However, adjacent memory cells on the same word line share the bit line in the non-volatile semiconductor device of a virtual ground type. If a distance is too short between the memory cells in which multiple bits are programmed simultaneously, there arises a problem in that a stress caused by programming is applied to other memory cells in which nothing is to be programmed.

FIG. 1 shows virtual ground type memory cells 0 through 4 that are connected to a word line WL and share bit lines. FIG. 1 also shows metal bit lines MBL 0 through MBL 5 connected to drain regions and source regions of the memory cells 0 through 4, selector switches Ssel 0 through Ssel 5 that respectively connect the metal bit lines MBL 0 through MBL 5 to a ground line, and selector switches Dsel 0 through Dsel 5 that respectively connect the metal bit lines MBL 0 through MBL 5 to a data line. Here, FIG. 1 shows only a portion of the non-volatile semiconductor device that is necessary for description.

For example, assuming that the metal bit line MBL 0 is set to a low level and the metal bit line MBL 1 is set to a high level so as to write data into the memory cell 0. At the same time, assuming that the metal bit line MBL 2 is set to the low level and the metal bit line MBL 3 is set to the high level so as to write data into the memory cell 2. Here, the memory cell 1 interposed by the memory cell 0 and the memory cell 2 connects the gate thereof to the word line WL, which is also shared by the memory cell 0 and memory cell 2. The metal bit line MBL1 is set to the high level and the metal bit line MBL 2 is set to low level, and the data is also written in the memory cell 1. That is to say, the stress caused by writing is applied to the memory cell into which data does not have to be written.

SUMMARY OF THE INVENTION

The present invention has been made in view of the above circumstances and has an object of providing a semiconductor device and a programming method so that multiple bits can be programmed simultaneously and stably.

According to an aspect of the present invention, preferably, there is provided a semiconductor device including: word lines; bit lines; non-volatile memory cells connected to the word lines and the bit lines, pages being defined for each of the word lines, each of the pages having a given number of non-volatile memory cells; and a select and write circuit selecting pages that are not adjacent to each other and simultaneously programming memory cells of the pages thus selected. The stress caused by programming is not applied to the memory cells that are not to be programmed, by increasing a distance between the memory cells that are programmed simultaneously.

The semiconductor device may include the pages including even-numbered pages and odd-numbered pages related to one of the word lines; and the select and write circuit programs the non-volatile memory cells of the even- or odd-numbered pages first and programs the non-volatile memory cells of the odd- or even-numbered pages second. The even- or odd-numbered pages are programmed in turn, and it is thus possible to realize the multiple bits can be programmed without changing the configuration of the memory cell array or decoding for a bit line selection.

On the above-mentioned semiconductor device, the select and write circuit may set bit lines connected to memory cells of pages that are not programmed to a floating state. The bit lines of the memory cells into which the data is not programmed are set to the floating state. This prevents the cell current flowing the memory cells into which the data is not programmed through the bit line. Thus, there does not arise a problem in that an unnecessary data is programmed or the stress is applied to the memory cell.

The semiconductor device may have blocks related to one of the word lines, and each of the blocks has a given number of pages; the semiconductor device has a first mode in which one of the given number of pages in each of the blocks is simultaneously programmed, and a second mode in which even- or odd-numbered pages in each of the blocks are simultaneously programmed; and the semiconductor device comprises a control circuit that causes the select and write circuit to operate in one of the first and second modes in accordance with an external command applied to the semiconductor device. The data can be programmed in the multiple modes, and the programming speed can be adjusted so as to program the data in accordance with the operator's choice.

The semiconductor device may further include a high-voltage generating circuit generating a high voltage for programming the non-volatile memory cells, wherein the select and write circuit activates selected bit lines using the high voltage generated by the high-voltage generating circuit. The power is not supplied from an external device, and the data can be programmed with the semiconductor device only.

The semiconductor device may further include a high-voltage generating circuit generating a high voltage for programming the non-volatile memory cells; and a selector circuit selecting the high voltage generated by the high-voltage generating circuit in the first mode and selecting another high voltage applied from an outside of the semiconductor device in the second mode, a selected high voltage being supplied to the select and write circuit. The programming mode changes from where the high voltage is supplied, and the programming mode that cannot be achieved with an internal high-voltage generating circuit can be available. Thus, the number of bits to be programmed simultaneously can be increased.

The semiconductor device may further include a programming level equalizing circuit generating dummy programming current equal to the number of memory cells that are not programmed among simultaneously programmable memory cells. The voltage drop can be maintained constant when the data is programmed. The programming level of the data to be programmed into the memory cell can be kept constant.

On the semiconductor device, the programming level equalizing circuit may include programming level equalizing sub-circuits; and each of the programming level equalizing sub-circuits is provided to a respective pair of two adjacent pages that are not simultaneously programmed. The voltage drop can be kept constant at the time of programming the data, by flowing the current substantially equal to the cell current across the programming level equalizing circuit. The cell current flows from the selected bit line to the memory cell. Thus, the data programming level to be programmed in the memory cell can be kept constant. The programming level equalizing circuit can be shared by the adjacent two pages in which the data is not programmed simultaneously. Thus, the number of circuits can be reduced, and the device configuration can be scaled down.

On the semiconductor device, each of the programming level equalizing circuit may be capable of producing a current approximately equal to a programming current that flows in one memory cell in programming.

On the semiconductor device, the non-volatile memory cells may be of a virtual ground type in which adjacent memory cells share a bit line. When the data is simultaneously programmed in multiple memory cells of the virtual ground type, the stress is applied to the memory cell into which the data is not programmed, if the distance between the memory cells is too short. With the above-mentioned semiconductor device, multiple bits can be programmed simultaneously and stably.

According to an aspect of the present invention, preferably, there is provided a method of programming non-volatile memory cells, including the steps of: selecting pages that are not adjacent to each other in which the pages thus selected being related to one word line, and each of the pages has a given number of non-volatile memory cells; and simultaneously programming memory cells of the pages selected. An unnecessary stress caused by programming is not applied to the memory cell into which the programming is not performed by increasing the distance between the memory cells to be programmed simultaneously.

On the method, the pages include even-numbered pages and odd-numbered pages; and the step of programming comprises a step of programming the non-volatile memory cells of the even- or odd-numbered pages first and programming the non-volatile memory cells of the odd- or even-numbered pages second. Multiple bits can be programmed simultaneously without changing the configuration of the cell array or decoding for selecting the bit line, by the data is programmed into the even-numbered pages and the odd-numbered pages in turn.

The method may further include a step of setting bit lines connected to memory cells of pages that are not programmed to a floating state. The floating state is set to the bit line of the memory cell of the page into which the data is not programmed. This can prevent the cell current flowing across the memory cell into which the data is not programmed through the bit line. Thus, there doesn't arise a problem in that an unnecessary data is not programmed in the memory cell or the stress is applied to the memory cell.

On the method, the steps of selecting and programming may relate to a first mode, and the method comprises the steps of: programming the non-volatile memory cells in a second mode in which one of a given number of pages in each of blocks related to one word line is simultaneously programmed; and selecting one of the first and second modes in accordance with an external command. The programming speed can be adjusted by programming the data in multiple programming modes.

DESCRIPTION OF THE PREFERRED EMBODIMENTS

A description will now be given, with reference to the accompanying drawings, of embodiments of the present invention.

Figure 1:
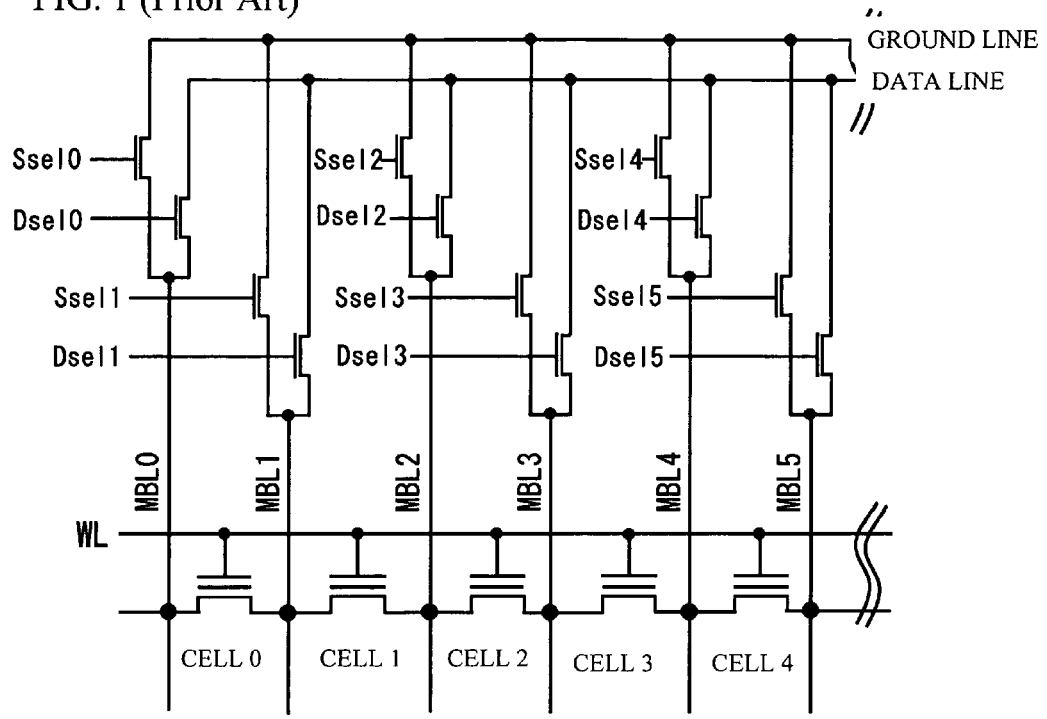
FIG. 1 illustrates how to program into a conventional semiconductor device.
Figure 2:
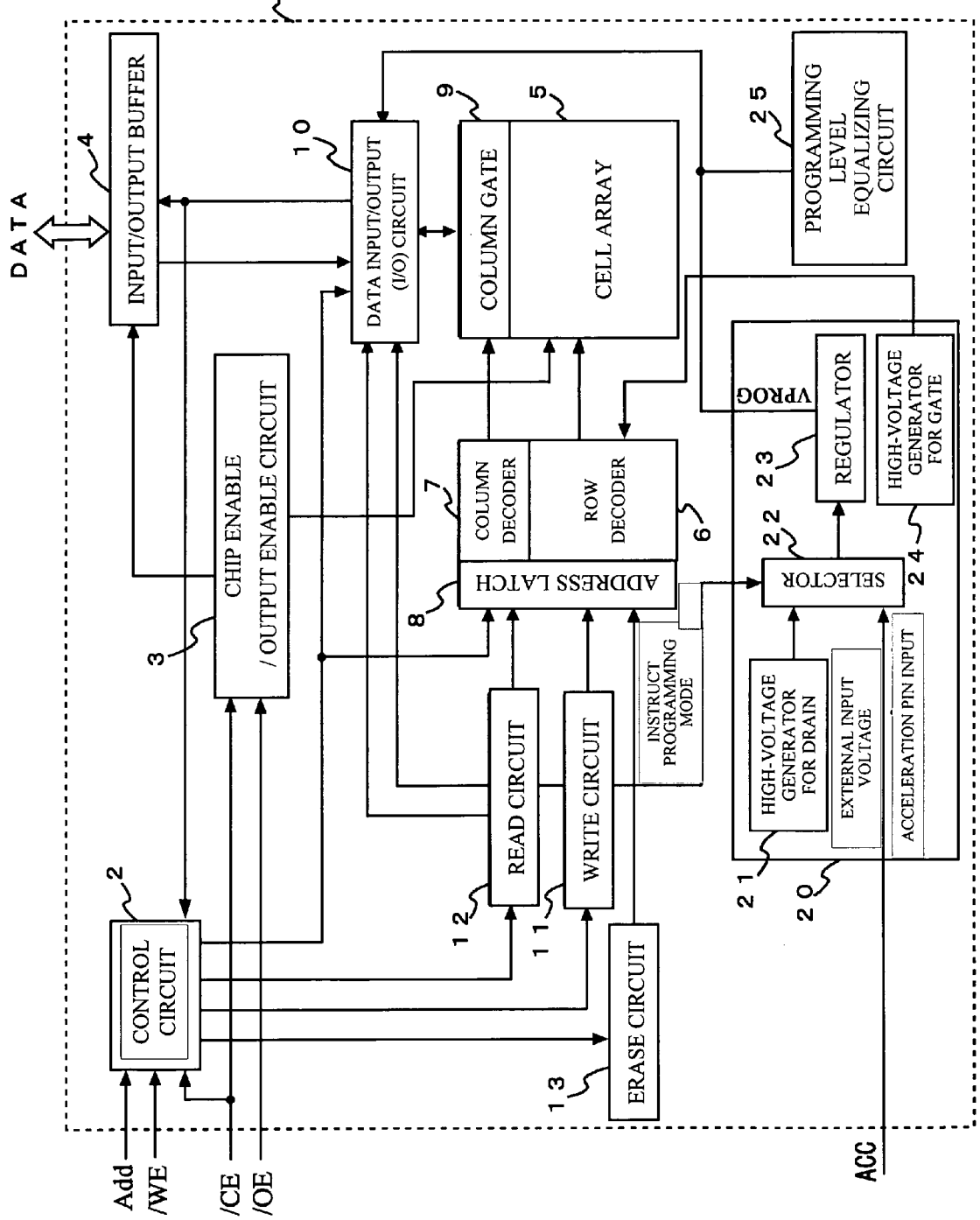
FIG. 2 is a block diagram showing a configuration of a semiconductor device of the present invention.

FIG. 2 shows a configuration of a semiconductor in accordance with an embodiment of the present invention. The semiconductor device in FIG. 2 is an embodiment of a non-volatile semiconductor memory device 1 including a control circuit 2, a chip enable/output enable circuit 3, an input/output buffer 4, a cell array 5, a row decoder 6, a column decoder (select and write means) 7, an address latch 8, a column gate 9, a data input/output circuit (I/O) 10, a write circuit 11, a read circuit 12, an erase circuit 13, and a power supply 20. The power supply 20 includes a high-voltage generator 21 for drain, a selector 22, a regulator 23, and a high-voltage generator for gate 24.

The control circuit 2 receives control signals such as a write enable (/WE) and a chip enable (/CE), an address signal, and a data signal from the outside, and serves as a state machine based on these signals so as to control each part of the non-volatile semiconductor memory device 1.

The input/output buffer 4 receives data from the outside and supplies the data to the control circuit 2 and the data input/output circuit (I/O) 10.

The chip enable/output enable circuit 3 receives a chip enable signal (/CE) and an output enable signal (/OE) as control signals from outside the device, and controls operation/non-operation of the input/output buffer 4 and the cell array 5.

The read circuit 12 operates under the control of the control circuit 2, and controls the cell array 5, the row decoder 6, and the column decoder (select and write means) 7 to read the data from a read-out address of the cell array 5. The write circuit 11 operates under the control of the control circuit 2, and controls the cell array 5, the row decoder 6, and the column decoder (select and write means) 7 to program the data into a write address of the cell array 5. The erase circuit 13 operates under the control of the control circuit 2, and controls the cell array 5, the row decoder 6, and the column decoder (select and write means) 7 to erase a designated region of the cell array 5 by a given unit at one time.

The cell array 5 is a memory of the virtual ground type, and includes an arrangement of the memory cells, the word lines, and the bit lines, and stores two-bit data in each memory cell. An oxide film, a nitride film, and another oxide film are stacked sequentially between a control gate and a substrate. A charge is trapped in the nitride film to change the threshold value and distinguish between "0" and "1". A trap layer made of the nitride film is an insulating film, and the charge does not move. Two bits can be stored by storing the charges on both edges of the trap layer. The method of storing two bits in one cell may be denoted as a mirror bid method. The cell array 5 may be a memory cell with a floating gate made of polysilicon, serving as a layer to store the charge.

When the data is read, the data is read out to the bit line from the memory cell designated by the activated word line. When writing (hereinafter referred to as programming) or erasing the data, appropriate electric potentials are set to the word line and the bit line according to the respective operations so as to add or delete the charge to or from the memory cell.

Figure 3:
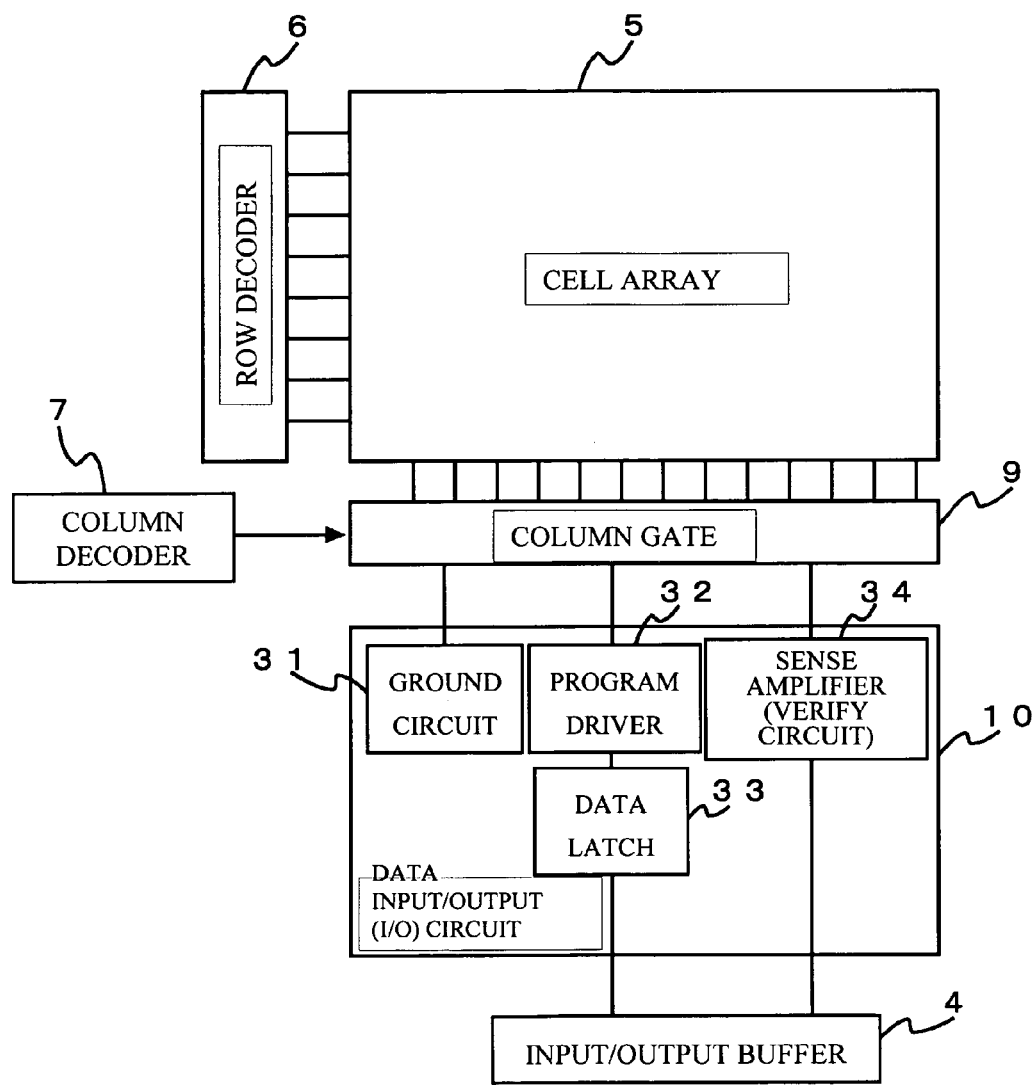
FIG. 3 shows a configuration of a data input/output (I/O) circuit.

The data input/output circuit (I/O) 10 operates under the control of the control circuit 2 to program and erase the data into and from the cell array 5. Referring to FIG. 3, the data input/output circuit (I/O) 10 will be described in detail. The data input/output circuit (I/O) 10 includes a ground circuit 31, a programming driver 32, a data latch 33, and a sense amplifier (verify circuit) 34, as shown in FIG. 3.

The ground circuit 31 is used for setting the bit line selected by the column decoder (select and write means) 7 to a ground level through the column gate 9. The data latch 33 receives the output signal from the column decoder (select and write means) 7, and latches the data input from the input/output buffer 4. The programming driver 32 transmits the data programmed in the data latch 33 to the bit line of the cell array 5 through the column gate 9.

The sense amplifier (verify circuit) 34 amplifies the data read out onto the bit line to a level that can be handled as a digital level. When programming the data, the programming driver 32 turns into a programming state and is connected to the bit line. When reading the data, the sense amplifier (verify circuit) 34 is connected to the bit line and the data on the bit line is amplified. When the page is selected and the programming is completed, the bit line of the page located adjacently to this page turns to the floating state.

The sense amplifier (verify circuit) 34 also judges the read-out data. The sense amplifier (verify circuit) 34 judges whether the data is 0 or 1 by comparing the current of the data with the reference current. The current of the data is supplied from the cell array 5 according to the designation made by the row decoder 6 and the column decoder (select and write means) 7. The reference current is supplied from a reference cell that is not shown. The judged result is supplied to the input/output buffer 4.

The verify operation in accordance with the programming operation and the erasing operation is performed by comparing the current of the data supplied from the cell array 5 with the reference currents for program verification and erase verification, according to the designation by the row decoder 6 and the column decoder (select and write means) 7. The reference current is supplied from the reference cell used for the program verification and the erase verification.

The row decoder 6 selectively drives multiple word lines WL based on the respective addresses, when the data is programmed, erase, and read. A given high voltage is supplied from the high-voltage generator for gate 24 shown in FIG. 2 to a word line driver (not shown).

The column decoder (select and write means) 7 controls the column gate 9 based on the address retained by the address latch 8. The column gate 9 is selected by the column decoder 7, and the corresponding sense amplifier (verify circuit) 34 is selected in the data input/output circuit (I/O) 10.

For example, when the data is read out of a desired memory cell in the cell array 5, the column gate connects the bit line connected to this memory cell to the corresponding sense amplifier (verify circuit) 34.

When the data is programmed in the desired memory cell in the cell array 5, the desired memory cell is activated by the address data input from the outside, the input programming data is output from the data latch 33 to the bit line through the column gate 9, and is programmed in the desired memory cell in the cell array 5.

The power supply 20 supplies the high voltage to the data input/output circuit (I/O) 10. The high voltage is generated by the high-voltage generator for drain 21 provided in the non-volatile semiconductor memory device 1. The power supply 20 supplies the high voltage generated by the high-voltage generator for gate 24 to the row decoder 6 and the column decoder (select and write means) 7. The power supplied by the power supply 20 is used for the power for decoding, which is necessary for the programming operation and erasing operation. In the present embodiment, the high voltage is generated in the high-voltage generator 21 in the non-volatile semiconductor memory device 1 to supply the data input/output circuit (I/O) 10, and in addition, the high voltage input from the outside can be used for the power supply for decoding. The power supply having a high current-supply capability is required for programming a larger amount of data at a high speed. In these years, according to the lowered voltage of the power supply voltage, the high-voltage generating circuit 21 in the non-volatile semiconductor memory device 1 has limitations of the number of bits that can be programmed simultaneously. Therefore, when the number of the bits to be programmed simultaneously is large (64-bit simultaneous programming mode as described later), the high voltage is supplied from the outside to be set to the power for decoding. The voltage supplied from the outside is input from an acceleration pin (ACC pin) shown in FIG. 2. The selector 22 outputs the voltage input from the outside to the regulator 23, when the programming mode is the 64-bit simultaneous programming mode. When the programming mode is a 16-bit simultaneous programming mode, the high voltage generated in the high-voltage generator 21 is output to the regulator 23. The instruction of the programming mode is notified by a programming mode instruction signal from the write circuit 11 shown in FIG. 2. The regulator 23 smoothes the supplied high voltage to make a constant voltage, and outputs the constant voltage to a power supply line (VPROG). When the power supply 20 has a high capability of supplying current, the power is not supplied from the outside, and the data may be programmed only with the high voltage supplied from the power supply 20.

Figure 4:
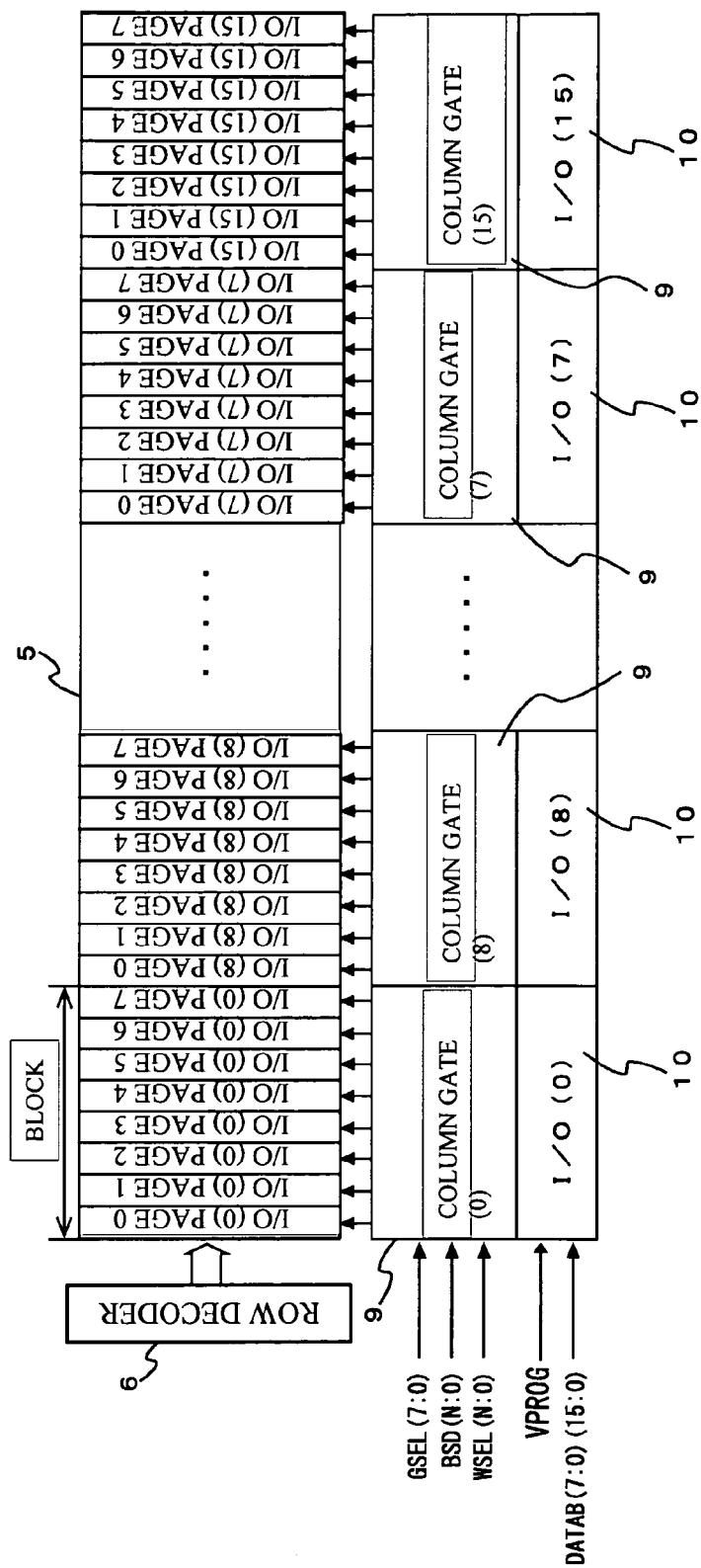
FIG. 4 shows relationship between a cell array and a column gate and a data input/output (I/O) circuit.

Referring to FIG. 4, a description will be given of relationships between the cell array 5 and the data input/output circuit (I/O) 10 and the column gate 9. One cell array 5 is divided into multiple blocks along with the bit line. In the present embodiment, each cell array 5 is divided into 16 blocks. Each block includes the data input/output circuit (I/O) 10 and the column decoder (select and write means) 7 so that the number of data equal to the number of the blocks can be input and output in parallel. In FIG. 4, the data input/output circuit (I/O) 10 is indicated as I/O. One block is divided into eight pages. The data input/output circuit (I/O) 10 selects the memory cell by the page so as to program and read the data.

The non-volatile semiconductor memory device 1 of the present embodiment has the 64-bit simultaneous programming mode and the 16-bit simultaneous programming mode. 64 bits are simultaneously programmed in the 64-bit simultaneous programming mode, and 16 bits are simultaneously programmed in the 16-bit simultaneous programming mode.

Figure 5:
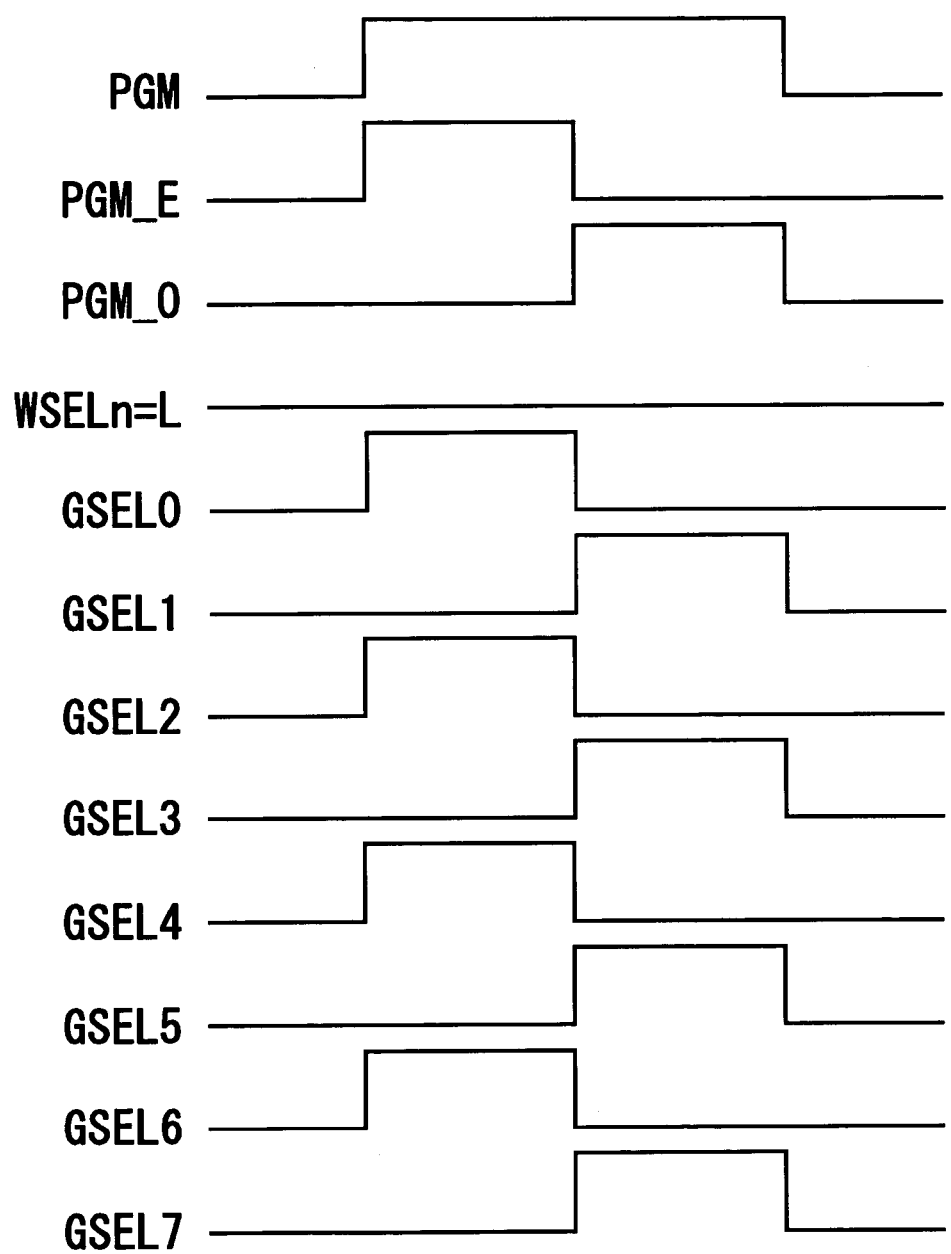
FIG. 5 is a timing chart of 64-bit simultaneous programming mode.

In the 64-bit simultaneous programming mode, the cell array 5 is divided into even-numbered pages and odd-numbered pages. 64-bit data is programmed into the even-numbered pages or the odd-numbered pages simultaneously. FIG. 5 shows signals output from the column decoder (select and write means) 7 in the 64-bit simultaneous programming mode. Referring to FIG. 5, the column decoder (select and write means) 7 outputs an even-numbered page selection signal (PGM_E) and an odd-numbered page selection signal (PGM_O), while the program signal (PGM) indicating a programming permission is high. The even-numbered page selection signal (PGM_E) denotes that the even-numbered page is selected, and the odd-numbered page selection signal (PGM_O) denotes that the odd-numbered page is selected. The even-numbered page selection signal (PGM_E) comes to have a high level, and even pages of 0, 2, 4, and 6 are selected by the column gate 9. At the same time, the odd-numbered page selection signal (PGM_O) comes to have a high level, and odd pages of 1, 3, 5, and 7 are selected by the column gate 9.

GSEL signals (GSEL 0 to GSEL 7) are used for connecting the selected bit line to the ground line. While the signals of the GSEL 0, 2, 4, and 6 have high levels, the signals of the GSEL 1, 3, 5, and 7 have low levels. On the contrary, while the signals of the GSEL 1, 3, 5, and 7 have high levels, the signals of the GSEL 0, 2, 4, and 6 have low levels. For example, the selected bit line of the even-numbered page in which the data is to be programmed is connected to the ground line, and the bit line is set to the low level. At this time, the odd-numbered page is not programmed and the GSEL signal has the low level, resulting in that the bit line has the floating state. When the data is programmed in the even numbered pages, the bit lines of the odd-numbered pages are set to have the floating state. This can prevent a cell current from flowing across the bit lines into the memory cells that are not programmed. That is, the memory cells, which are not to be programmed, exist between the memory cells to be programmed. Thus, an unnecessary data is not programmed in the memory cell into which nothing is to be programmed, and the stress is not applied. In addition, the even-numbered pages and the odd-numbered pages are not programmed at the same time, and the distances between the memory cells to be programmed simultaneously are increased. This does not apply the unnecessary stress to the memory cell. Furthermore, the data is programmed in the even-numbered pages and the odd-numbered pages in turn. It is thus possible to program the multiple bits simultaneously without changing the configuration of the memory cell array or decoding of the bit line selection.

Figure 6:
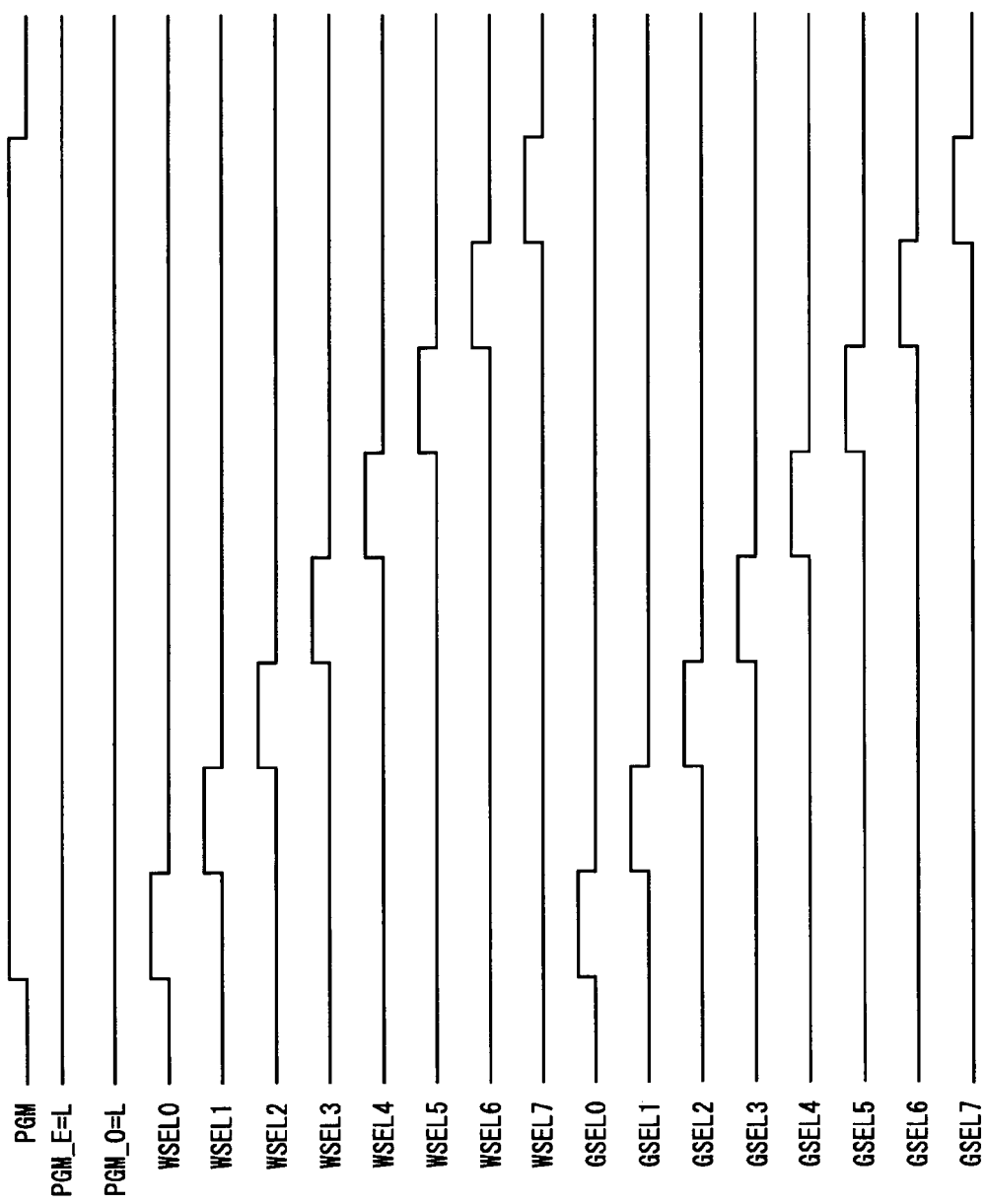
FIG. 6 is a timing chart of 16-bit simultaneous programming mode.

In the 16-bit simultaneous programming mode, the 16 blocks shown in FIG. 4 are respectively selected, and the data is programmed in any one of the pages in the selected block. FIG. 6 shows a timing chart. The column decoder (select and write means) 7 generates the cell signals (WSEL 0 through WSEL 7) to select the memory cell to output to the column gate 9, while the program signal (PGM) indicating the programming permission shown in FIG. 6 has a high level. The cell signals of WSEL 0 through WSEL 7 correspond to the pages of each block. That is, when the WSEL 0 has a high level, the page 0 is selected and the data is programmed into the page 0. In the same manner, the WSEL 1 has a high level, a page 1 is selected and the data is programmed in the memory cell of the page 1.

In the same manner as the 64-bit simultaneous programming mode, the GSEL signals (GSEL 0 through GSEL 7) are output and the bit line to be a source of the page being programmed is connected to the ground line. The bit lines that are not programmed are set to have the floating state.

Figure 7:
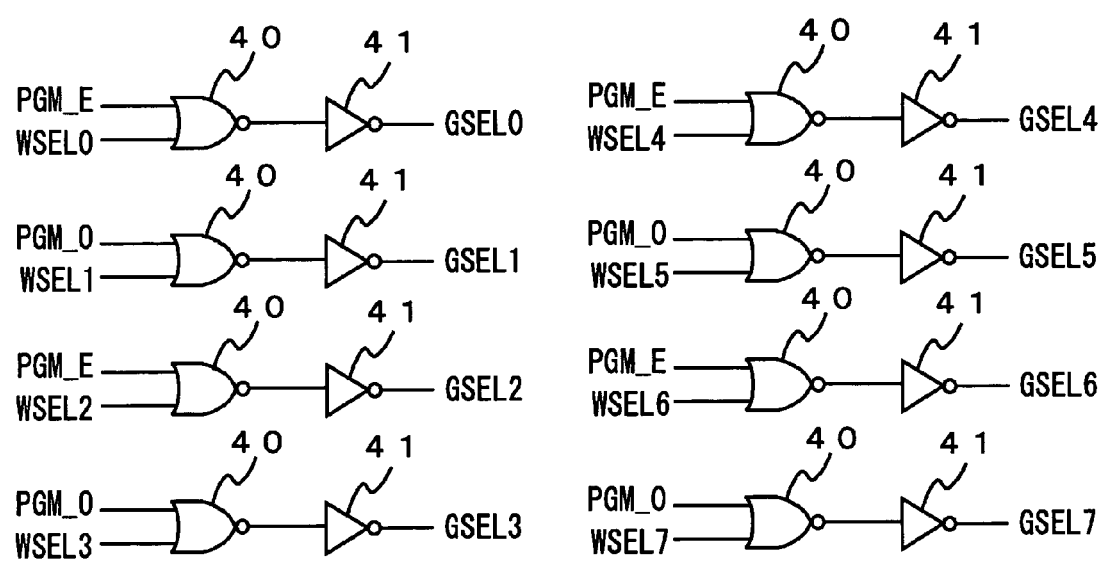
FIG. 7 shows a logic gate to generate a GEL signal.

FIG. 7 shows logic gates that generate the GSEL signals. These logic gates are included in the column decoder 7. The GSEL signals (GSEL 0, 2, 4, and 6) for the even-numbered pages input an even-numbered selection signal (PGM_E) and each of the cell signals (WSEL 0, 2, 4, and 6) to a NOR gate 40. The output from the NOR gate 40 is generated by inverting with an inverter 41. In the same manner, the GSEL signals (GSEL 1, 3, 5, and 7) for the odd-numbered pages input an odd-numbered selection signal (PGM_O) and each of the cell signals (WSEL 1, 3, 5, and 7) to the NOR gate 40. The output from the NOR gate 40 is generated by inverting with the inverter 41.

Figure 8:
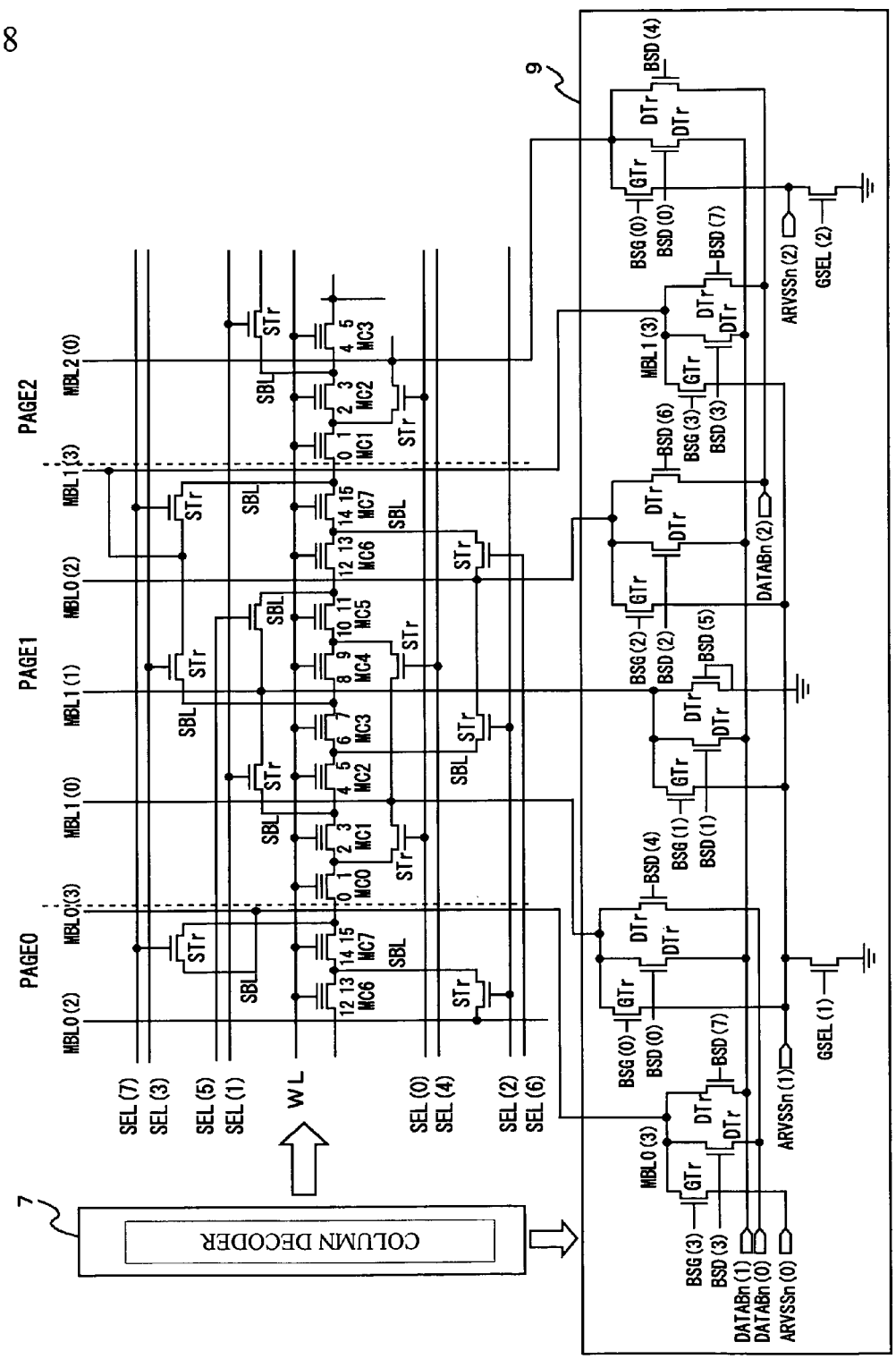
FIG. 8 shows a configuration of the cell array 5 and the column gate.

FIG. 8 shows a configuration of the cell array 5 and the column gate 9 in detail. FIG. 8 shows multiple word lines WL (only one WL is shown for simplification in FIG. 8) and multiple metal bit lines MBL, and memory cells MC that are arranged close to crossing points of the word line WL and the metal bit line MBL. Two memory cells MC are formed between two metal bit lines MBL. Eight memory cells MC (MC 0 through MC 7 shown in FIG. 8) are provided in one page, which is a unit for programming and reading. Two bits can be stored in one memory cell MC. The two memory cells MC are provided between the two metal bit lines, and a sub bit line SBL is provided to connect the memory cells MC to the two bit lines. The sub bit line SBL is formed in a diffusion layer and is provided in parallel with the metal bit line MBL. The sub bit line SBL is connected to the metal bit line MBL through a selection transistor (STr shown in FIG. 8) that receives a decode signal output from the column decoder 7 as a gate input.

Each of the metal bit lines MBL includes a first transistor (GTr shown in FIG. 8) and a second transistor (DTr shown in FIG. 8). The first transistor selectively changes whether or not the metal bit line MBL is connected to a ground line (ARVSS). The second transistor selectively changes whether or not the metal bit line MBL is connected to a drain signal line (DATAB). The first transistor GTr and the second transistor DTr are selectively changed between open and close according to the decode signal applied from the column decoder (select and write means) 7 to be connected to the metal bit lines MBL. The signals generated in the column decoder (select and write means) 7 are signals BSD and BSG shown in FIG. 8. When the BSD signal becomes a high level, the second transistor DTr is closed to connect the corresponding bit line and the drain signal line (DATAB). When the BSG signal becomes a high level, the first transistor GTr is closed to connect the corresponding bit line and the ground signal line (ARVSS). A ground line ARVSSn is provided on every page independently.

In the above-mentioned 64-bit simultaneous programming mode, when the GSEL signals 1, 3, 5, and 7 transit to the high levels, the GSEL signals 0, 2, 4, and 6 become the low levels. If the page 1 shown in FIG. 8 is selected for programming, the ground line of an adjacent page 2 is set to the floating state by the GSEL (2) shown in FIG. 8.

Figure 9:
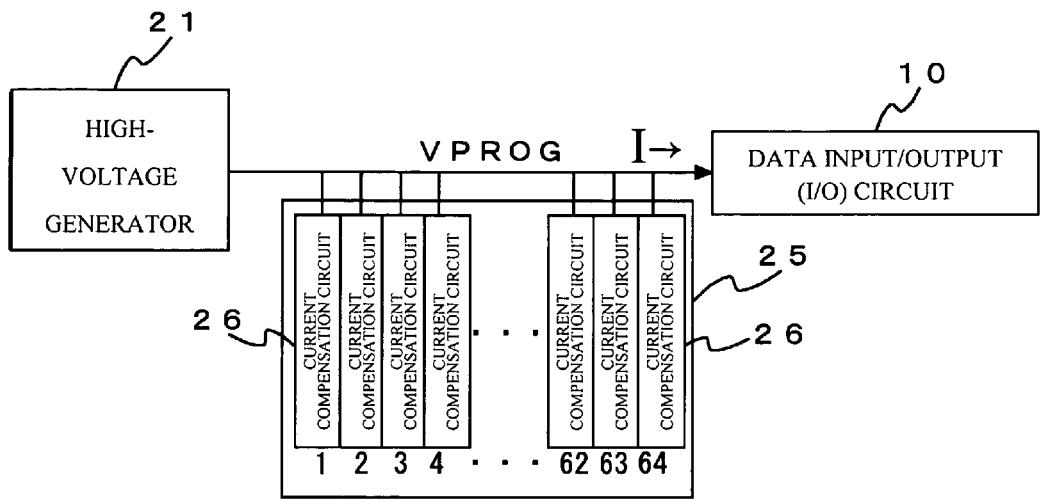
FIG. 9 shows a configuration of a programming level equalizing circuit.

A description will now be given of a programming level equalizing circuit 25 connected to a power supply line VPROG shown in FIG. 2. The programming level equalizing circuit 25 is composed of multiple current compensation circuits 26 as shown in FIG. 9. The current compensation circuit 26 serves as a programming level equalizing sub-circuit, flows a dummy programming current that is a given current amount from the power supply line VPROG, and adjusts a voltage drop constantly at the time of programming the data. A voltage drop level supplied from the power supply 20 has to be maintained constant at the time of programming, in order to maintain the data programming level to be programmed in the memory cell. On the non-volatile semiconductor memory device 1 in accordance with the present embodiment, only if the data of "0" is programmed, the high voltage is supplied to the data line and the bit line is selected to flow the cell current in the memory cell. Therefore, there are provided the current compensation circuits 26, as many in number as the multiple bits of data that can be written simultaneously, and the cell currents of the memory cells for as many as the memory cells into which the data of "0" is not written are made to flow by the current compensation circuits 26, in order to maintain the voltage drop level constant when the multiple bits of data are simultaneously programmed. For example, when 16 memory cells are programmable simultaneously and there are three memory cells in which "0" is programmed, the programming level equalizing circuit 25 is set to flow the programming current equal to the total programming current of 13 memory cells. In the same manner, when 64 memory cells are programmable simultaneously and there are three memory cells in which "0" is programmed, the programming level equalizing circuit 25 is set to flow the programming current equal to the total programming current of 61 memory cells.

However, the 16-I/O, eight-page cell array 5 shown in FIG. 4 require 128 current compensation circuits 26, resulting in that the number of the circuits increases and the circuit size becomes larger. Therefore, in the present embodiment, one current compensation circuit 26 is provided for memory cells in two adjacent pages that are not programmed simultaneously so that the circuit size does not become larger.

Figure 10:
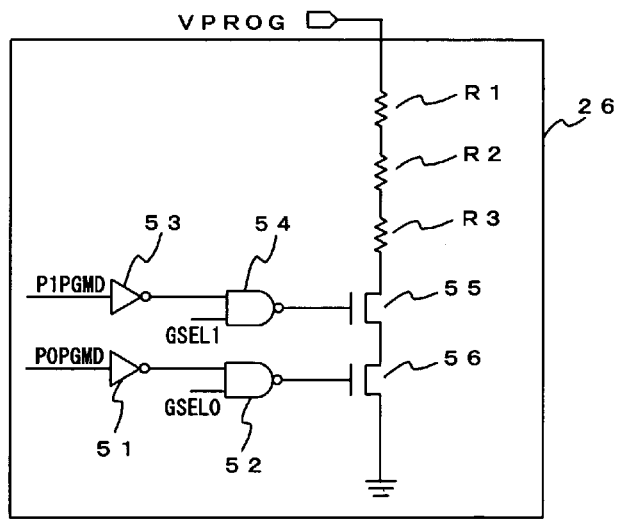
FIG. 10 shows a configuration of a current compensation circuit.

FIG. 10 shows a configuration of the current compensation circuit 26. The current compensation circuit 26 corresponds to the page 0 and page 1. Resistors R1, R2, and R3 and switch transistors 55 and 56 are connected in series with the power supply line VPROG. An inverter 51 and a NAND gate 52 are connected to a gate of the switch transistor 56. In the same manner, an inverter 53 and a NAND gate 54 are connected to a gate of the switch transistor 55.

A POPGMD signal, which is a programming data of the page 0, is input into the inverter 51. The output from the inverter 51 is input into the NAND gate 52. The output signal from the inverter 51 and the signal GSEL 0 are input into the NAND gate 52. The signal GSEL 0 connects the bit line selected according to the data to the ground line, when the page 0 is selected for programming. The output of the NAND gate 52 is a gate input of the switch transistor 56. In the same manner, a P1PGMD signal, which is a programming data of the page 1, is input into the inverter 53. The output from the inverter 53 is input into the NAND gate 54. The output signal from the inverter 53 and the signal GSEL 1 are input into the NAND gate 54. The signal GSEL 1 connects the bit line selected according to the data to the ground line, when the page 1 is selected for programming. The output of the NAND gate 54 is the gate input of the switch transistor 55.

Except when the data of "0" is programmed, the switch transistors 55 and 56 turn on to flow a given amount of current from the power supply line VPROG. This given amount of current is set substantially equal to the programming current that flows when the data of "0" is programmed into the memory cell. For example, when "0" is programmed in the page 1, the P1PGMD signal becomes the low level. The page selected for programming has the high level of the GSEL signal (GSEL 1, in this case), and the signal output from the NAND gate 54 according to the level of the PAPGMD signal is input into the gate of the switch transistor 55. When the page is not selected for programming, the GSEL signal (GSEL 1) has the low level and the signal having the high level is always output to the switch transistor 55. Then, the switch transistor 55 turns on, and the current flows across the resistors R1, R2, and R3 from the power supply line VPROG.

Although a few preferred embodiments of the present invention have been shown and described, it would be appreciated by those skilled in the art that changes may be made in these embodiments without departing from the principles and spirit of the invention, the scope of which is defined in the claims and their equivalents. The non-volatile semiconductor memory device has been described in the above-mentioned embodiments as an example. However, the present invention is applicable to a semiconductor device having the non-volatile semiconductor memory device mounted thereon.

What is claimed is:

1. A semiconductor device comprising:
   word lines;
   bit lines;
   non-volatile memory cells connected to the word lines and the bit lines. pages being defined for each of the word lines, each of the pages having a given number of non-volatile memory cells; and
   a select and write circuit selecting pages that are not adjacent to each other and simultaneously programming memory cells of the pages thus selected, further comprising a programming level equalizing circuit generating dummy programming current equal to programming current through the number of memory cells that are not programmed among simultaneously programmable memory cells.

2. The semiconductor device as claimed in claim 1, wherein:
   the pages include even-numbered pages and odd-numbered pages related to one of the word lines; and
   the select and write circuit programs the non-volatile memory cells of the even- or odd-numbered pages first and programs the non-volatile memory cells of the odd- or even-numbered pages second.

3. The semiconductor device as claimed in claim 1, wherein the select and write circuit sets bit lines connected to memory cells of pages that are not programmed to a floating state.

4. The semiconductor device as claimed in claim 1, wherein:
  the semiconductor device has blocks related to one of the word lines, and each of the blocks has a given number of pages;
  the semiconductor device has a first mode in which one of the given number of pages in each of the blocks is simultaneously programmed, and a second mode in which even- or odd-numbered pages in each of the blocks are simultaneously programmed; and
  the semiconductor device comprises a control circuit that causes the select and write circuit to operate in one of the first and second modes in accordance with an external command applied to the semiconductor device.

5. The semiconductor device as claimed in claim 1. Further comprising a high. voltage generating circuit generating a high voltage for programming the non-volatile memory cells, wherein the select and write circuit activates selected bit lines using the high voltage generated by the high-voltage generating circuit.

* * * * *